(12) United States Patent
Fischer et al.

(10) Patent No.: US 7,433,668 B2
(45) Date of Patent: Oct. 7, 2008

(54) CONTROLLING Q-FACTOR OF FILTERS

(75) Inventors: Georg Fischer, Nüremberg (DE); Gerhard Kaminski, Fuerth (DE); Wolfgang Franz Eckl, Spardorf (DE)

(73) Assignee: Lucent Technologies Inc., Murray Hill, NJ (US)

( * ) Notice: Subject to any disclaimer, the term of this patent is extended or adjusted under 35 U.S.C. 154(b) by 706 days.

(21) Appl. No.: 11/021,481

(22) Filed: Dec. 23, 2004

(65) Prior Publication Data

US 2006/0141957 A1    Jun. 29, 2006

(51) Int. Cl.
    *H04B 1/16*    (2006.01)
(52) U.S. Cl. .................................. 455/339; 455/340
(58) Field of Classification Search ................ 455/339, 455/340
    See application file for complete search history.

(56) References Cited

U.S. PATENT DOCUMENTS

| | | | | |
|---|---|---|---|---|
| 5,025,346 | A * | 6/1991 | Tang et al. | 361/283.1 |
| 5,136,267 | A * | 8/1992 | Cabot | 333/174 |
| 5,471,168 | A * | 11/1995 | Sevenhans et al. | 327/553 |
| 5,491,604 | A * | 2/1996 | Nguyen et al. | 361/278 |
| 5,541,866 | A * | 7/1996 | Sato et al. | 708/323 |
| 5,550,520 | A * | 8/1996 | Kobayashi | 333/213 |
| 5,661,432 | A * | 8/1997 | Chang et al. | 327/552 |
| 6,236,281 | B1 | 5/2001 | Nguyen et al. | 331/154 |
| 6,307,442 | B1 * | 10/2001 | Meyer et al. | 333/17.1 |
| 6,631,265 | B2 * | 10/2003 | Holden et al. | 455/439 |
| 6,983,136 | B2 * | 1/2006 | Mason et al. | 455/307 |
| 2004/0251958 | A1 * | 12/2004 | Paakonen | 327/552 |
| 2007/0008030 | A1 * | 1/2007 | Kasperkovitz | 327/552 |

FOREIGN PATENT DOCUMENTS

| | | |
|---|---|---|
| EP | 0 472856 A2 | 5/1992 |
| EP | 0 472856 A3 | 5/1992 |

OTHER PUBLICATIONS

Fischer., "Architectural benefits of wide bandage RF power transistors for frequency agile basestation systems," *IEEE WAMI*, Florida 2004, FD-1, 5 pgs.

(Continued)

*Primary Examiner*—Duc M Nguyen

(57) ABSTRACT

The present invention provides a method and an apparatus for controlling a Q-factor for a filter. The method comprises stabilizing an active feedback to provide a variable feedback in a filter, varying the active feedback based on an input signal to the filter, and producing a desired Q-factor for the filter at a first frequency band, in response to the variable feedback. The method further comprises reconfiguring a center frequency and a bandwidth of the filter based on a channel bandwidth of the input signal to the filter to adjust the Q-factor for the filter in response to a second frequency band different than the first frequency band. By reconfiguring a center frequency and a bandwidth of a filter, the Q-factor for the filter, such as a flexible or reconfigurable filter, may be controlled across a multiplicity of frequency band signals. Using software, for example, a common signal path may be provided for the multiplicity of frequency band signals within a frequency agile radio of a base station by tuning the radio based on a variable feedback through realization of a negative parallel resistance. Thus, tuneability of the Q-factor may provide frequency agile radios that include flexible or reconfigurable filters in a base station to serve different frequency bands without changing hardware. In this way, significant savings associated with frequency agility may be obtained.

35 Claims, 5 Drawing Sheets

OTHER PUBLICATIONS

European Search Report Application No. EP 04 25 8102.5-2215 dated Sep. 14, 2005.

T.L. Bagwell, et al.; "Development of an Ultra-Flat Saw Filter Module and its Application to Fass: A Frequency Agile Signal Source" IEEE 1989 Ultrasonics Symposium.

F.X. Moncunill-Geniz, et al. "A Comparative Analysis of Direct-Sequence Spread-Spectrum Super-Regenerative Architectures" IEEE 2001 UPC-Department of Signal Theory and Communications.

European Search Report Application No. EP 04 25 8102.5-2215 dated Jun. 22, 2005.

"XP-000725777 Filters using negative resistance" *Electronics World* Mar. 1997.

\* cited by examiner

CONTROLLING Q-FACTOR OF FILTERS

BACKGROUND OF THE INVENTION

1. Field of the Invention

This invention relates generally to telecommunications, and more particularly, to wireless communications.

2. Description of the Related Art

Most electronic circuits involve signal conditioning of analog, digital and/or mixed signals. Such signal conditioning produces signals that often undergo further processing including filtering, sampling, amplification and/or digitizing because real world signals contain static or dynamic information both wanted and unwanted. As one example, to maintain a secure link for communications, a frequency hopping technique may be used where the frequency of a transmitter and a receiver changes rapidly, causing noise and/or interference. Because of this frequency change, many communications systems get affected, often making filtering necessary.

Generally, filtering is a process or a mathematical operation of removing an undesired component of a signal while allowing a desired component to pass, e.g., attenuating unwanted frequencies in the signal that may be identified by a spectral analysis. A filter is an electrical circuit that selectively separates a band of signal frequencies, allowing signals in certain frequency ranges to pass through, while attenuating or blocking all other frequencies. A filter provides a pass band, a stop band and a cutoff frequency or corner frequency that defines the frequency boundary between the pass band and the stop band.

For example, to pass a transmit or a receive frequency band of operation in a radio of a base station, one or more band pass or selective filters are generally used. A band pass or selective filter eliminates a selected set of frequencies from a spectrum of a signal, and in the case of a resonant circuit or filter, the band pass or selective filter decrease the level of other frequencies. That is, the resonant circuit or filter responds to frequencies close to a natural frequency much more strongly than to other frequencies. Typically, characteristics of such filters, such as a Q-factor, are fixed and cannot be readily altered. The Q-factor is a measure of a quality of a resonant circuit or filter. For a band pass or selective filter, a difference between an upper cutoff frequency and a lower cutoff frequency is called the bandwidth and the Q-factor is defined as a ratio of a center frequency and a bandwidth. While the center frequency may be a geometric mean between a lower cutoff frequency and an upper cutoff frequency of a frequency band, the bandwidth may be defined as a 3 dB change in level beside the center frequency.

Typically, a radio once manufactured for a specific type of frequency band only works for that specific type of frequency band. To alter frequency bands, one approach proposes use of a bank of different filters with fixed characteristics such that those filters are switched through a matrix. This approach involves more or less a parallel implementation of individual signal paths for each frequency band, which is opposite to the demand for a common signal path for all bands with a frequency agile radio. Although some gains may be obtained through a particular arrangement of the switches, this parallel implementation of individual signal paths for each frequency band adds significant costs to design. One shortcoming entails that every band adds another parallel path and that after manufacturing only an alteration inside a set of bands may be done. Therefore, if a regulation assigns a new frequency band, a tuning of the radio to that new frequency band is difficult, if impossible.

One fundamental problem for flexible or reconfigurable filters is that a technique for altering filter properties degrades the Q-factor, rendering the filters useless because a degraded Q-factor causes the bandwidth to become unacceptably large. However, for an accurate filter it is desirable to have higher Q-factors. A desired Q-factor for a typical filter is normally determined by a ratio of stop-band frequency to a pass-band corner frequency and by an amount of ideal stop-band attenuation. However, conventional filters have a poor Q-factor. The Q-factor and center-frequency of these filters are fixed (or mechanically tuned). Moreover, Q-factors of capacitors and inductors are often too low, especially if they are integrated ($Q<100$). Further, these Q-factors are typically fixed and cannot be readily varied. In many applications, therefore, one or more additional high-Q resonator filters are used. These high Q resonator filters have an added shortcoming of being very expensive.

As shown in FIG. 2, a prior art technique for improving and tuning a Q-factor uses an Audion receiver. A negative impedance is provided to a resonant circuit, which compensates for the losses, and thus, enhances the Q-factor and narrows the bandwidth. With the Audion receiver, one tube simultaneously serves for amplifying an audio signal and a radio frequency (RF) signal. A part of the amplified RF signal is positively fed back to a resonator in equal phase. One problem with the Audion receiver is that of a high risk of oscillation. That is, because of this oscillation a receiver could become a transmitter. The feedback is not stable since changes in the surroundings of an antenna and a headphone or a loudspeaker detunes the feedback. A feedback knob needs retuning in short intervals to either avoid a low feedback (bad reception) or a high feedback (oscillation). This feedback knob based retuning causes the receiver to fluctuate between a "satisfying" or "catastrophic" behavior.

The present invention is directed to overcoming, or at least reducing, the effects of, one or more of the problems set forth above.

SUMMARY OF THE INVENTION

In one embodiment of the present invention, a method controlling a Q-factor for a filter is provided. The method comprises stabilizing an active feedback to provide a variable feedback in a filter, varying the active feedback based on an input signal to the filter, and producing a desired Q-factor for the filter at a first frequency band in response to the variable feedback. The method further comprises reconfiguring a center frequency and a bandwidth of the filter based on a channel bandwidth of the input signal to adjust the Q-factor for the filter in response to a second frequency band different than the first frequency band.

In another embodiment, a filter comprises a resonant circuit having an input terminal and an output terminal and a feedback path coupled to the resonant circuit. Stabilization of feedback in the feedback path may provide a variable feedback. By burying the resonant circuit and through the use of one or more isolation amplifiers, an active feedback in the filter may be stabilized. In this way, the active feedback may be varied, for example, based on a channel bandwidth of an input signal to the filter to produce a desired Q-factor for the filter at a first frequency band in response to the variable feedback.

In yet another embodiment, an article comprising a computer readable storage medium storing instructions that, when executed cause a system to stabilize an active feedback to provide a variable feedback in a filter, vary the active feedback based on an input signal to the filter, and produce a desired Q-factor for the filter at a first frequency band in response to the variable feedback.

BRIEF DESCRIPTION OF THE DRAWINGS

The invention may be understood by reference to the following description taken in conjunction with the accompanying drawings, in which like reference numerals identify like elements, and in which.

Figure 1:
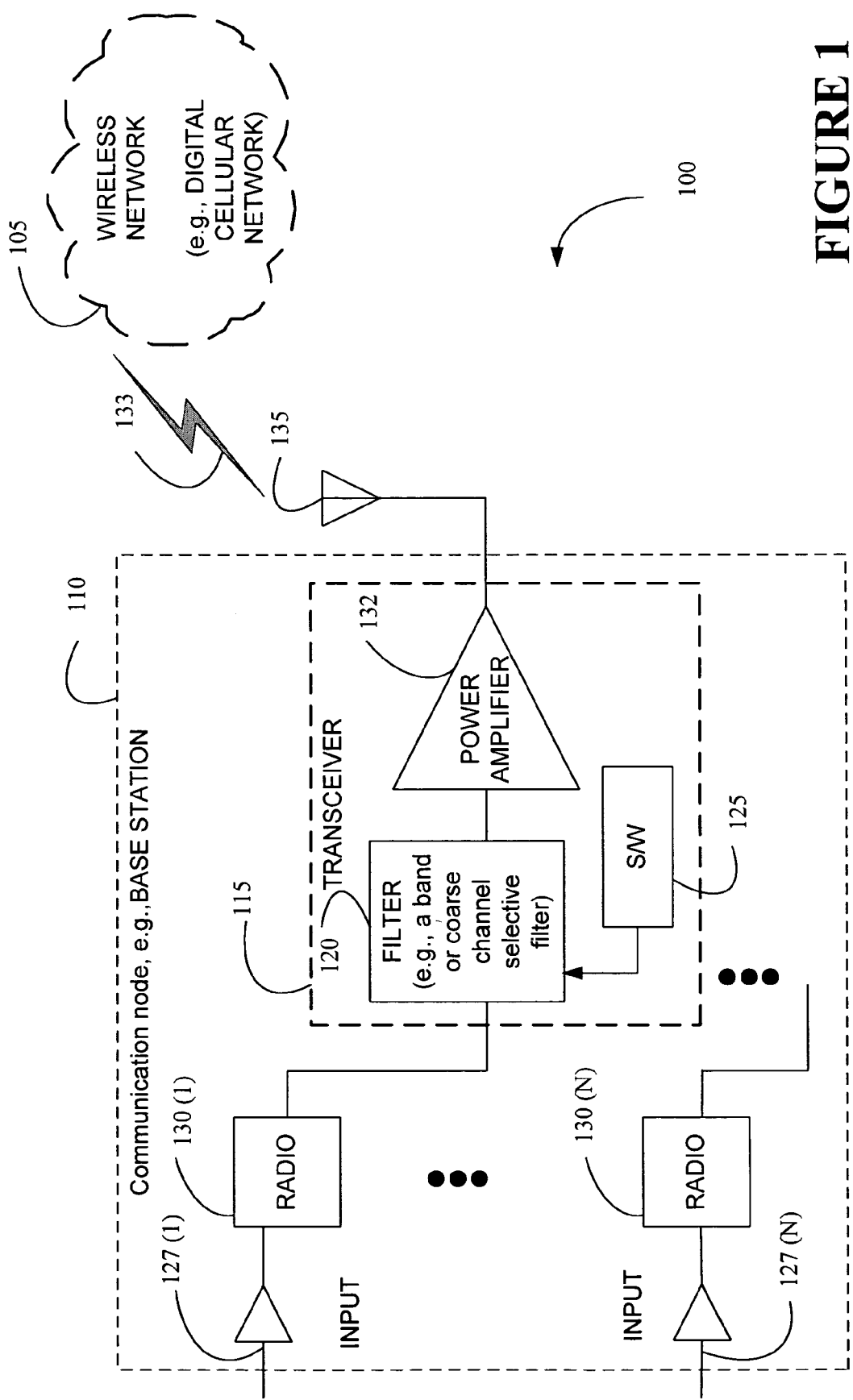
FIG. 1 illustrates a telecommunication system including a wireless network to communicate with a base station having a transceiver including a filter that uses one or more techniques to stabilize an active feedback to provide a variable feedback in a filter for realizing a desired Q-factor according to one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions may be made to achieve the developers' specific goals, such as compliance with system-related and business-related constraints, which may vary from one implementation to another. Moreover, it will be appreciated that such a development effort might be complex and time-consuming, but may nevertheless be a routine undertaking for those of ordinary skill in the art having the benefit of this disclosure.

Generally, a method and apparatus may be used to control a Q-factor for a filter across a multiplicity of frequency band signals. A feedback stabilization technique may stabilize an active feedback to provide a variable feedback in a filter for realizing a desired Q-factor at a first frequency band. By reconfiguring a center frequency and a bandwidth of the filter, for example, based on a channel bandwidth of an input signal, the Q-factor for the filter may be adjusted in response to a second frequency band different than the first frequency band. In this way, a flexible filter may serve as a channel selection filter (e.g., pre-selection and/or post-selection function) or as a band selection filter. Using software, for example, a common signal path may be provided for the multiplicity of frequency band signals within a frequency agile radio of a base station by tuning the radio based on a variable feedback through realization of a negative parallel resistance. Within the filter, in one embodiment, using the variable feedback, tolerances of an active feedback may be overcome. The feedback may be stabilized, and thus, also the amount of Q-factor enhancement. The risk of oscillation is also avoided. The stabilization may be realized by at least two means, for example, including a) using isolation amplifiers at an input and an output of a filter and b) burying a resonant structure inside a metal cavity/electrical shield. This tuneability of the Q-factor may provide frequency agile radios that include flexible or reconfigurable filters in a base station to serve different frequency bands without changing hardware. In this way, significant savings associated with frequency agility may be obtained.

Referring to FIG. 1, a telecommunication system 100 includes a wireless network 105 to communicate with a communication node, such as a base station 110 having a transceiver 115 including a filter 120 that uses one or more feedback techniques to stabilize an active feedback for providing a variable feedback in the filter 120 according to one illustrative embodiment of the present invention. The variable feedback may control an amount of feedback and by that control an amount of Q-factor enhancement for the filter 120. The amount of Q-factor enhancement is a consequence of how narrow the filter 120 has to be more. The narrower the filter 120 has to be, the higher the Q-factor has to be, and thus additional Q-factor enhancement may be provided using the variable feedback.

According to one embodiment of the present invention, the examples of the filter 120 include a flexible band selection filter and a coarse channel selection filter. Based on a channel bandwidth of an input signal to the filter 120, for example, the active feedback may be varied. The channel bandwidth generally refers to a bandwidth of the filter 120 that selects a desired channel, in one embodiment. The variable feedback may produce a desired Q-factor for the filter 120 at a first frequency band. Tuning of a center frequency and a bandwidth of the filter 120 may enable reconfiguring thereof for a second frequency band different than the first frequency band.

That is, in one embodiment, based on the channel bandwidth of the input signal, to cause variation in feedback, the center frequency and the bandwidth of the filter 120 may be tuned, adjusting the Q-factor to a desired level. The tuneability of Q is a consequence of different relative bandwidth needs. For instance, if a center frequency goes down by a factor 2 than Q can also go down by a factor 2. Likewise, if bandwidth is reduced to $\frac{1}{4}$, then a 4 times more Q is desired. So, a desired Q-factor is linked to the actually needed relative bandwidth. Therefore, the desired Q-factor is a consequence of both the bandwidth and the center frequency, i.e., Q=center frequency/bandwidth.

Figure 3:
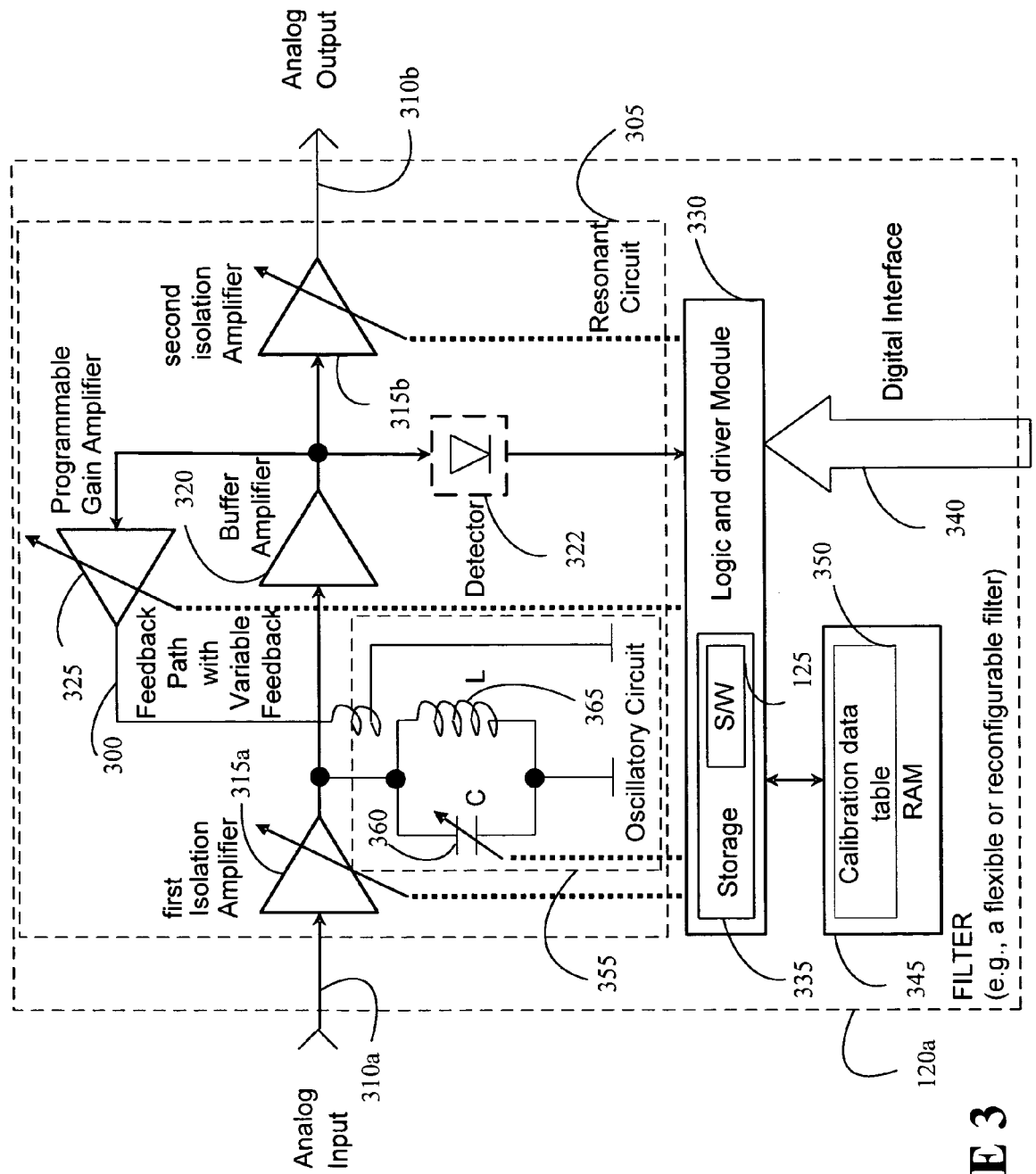
FIG. 3 depicts a flexible or reconfigurable filter with a stabilized feedback path for Q-factor enhancement that uses the feedback shown in FIG. 1 consistent with one embodiment of the present invention.

In operation, because a high or strong feedback than desired may cause oscillation and a low or weak feedback may not significantly enhance the Q-factor of a resonant circuit (as shown in FIG. 3), one or more feedback techniques may be used to stabilize an active feedback that provides a variable feedback in the filter 120. For example, such a feedback stabilization technique that stabilizes the active feedback may provide a stabilized feedback to ensure a stable Q-factor enhancement. To provide a positive feedback, a fraction of the voltage across a resonator may be coupled back into a resonant structure of the resonant circuit.

According to one feedback stabilization technique consistent with an embodiment of the instant invention, use of isolation amplifiers in the filter 120 may counteract any undesired or external influence caused by a varying source and/or load impedances. Another undesired or external influence on the filter 120 caused by additional capacitances that may cause detuning may be counteracted by burying and shielding the resonant circuit. A further undesired or external influence on the filter 120 may be caused by a temperature variation. That is, gain of an amplifier in a feedback path may change with temperature, resulting in a change in the amount of signal fed back to the resonant circuit. However, this feedback variation, unless rectified, such as with the use of a feedback stabilization technique, may result in extreme scenarios like a) no Q-factor improvement and b) oscillation.

In one embodiment, the transceiver 115, such as a radio manufactured for a specific type of frequency band may work for other types of frequency bands. For example, software or firmware may be used to alter a center frequency and a bandwidth depending upon a particular type of a frequency band. Examples of the filter 120 include a flexible, resonance or reconfigurable filter, which operate at a relatively low radio frequency (RF) power and have properties that may be altered to suit a particular frequency band and a band pass or selective filter.

Consistent with one embodiment, the base station 110 may include a plurality of input ports 127 (1-N) that may be coupled to a corresponding radio 130(1-N) before the transceiver 115 for conventional signal processing. The transceiver 115 of the base station 110 may further include a power amplifier 132 that may, in turn, be coupled to the filter 120. To transmit and/or receive wireless communications 133 at the base station 110 in the telecommunication system 100, an antenna 135 may be coupled to the filter 120 through the power amplifier 132.

In accordance with one embodiment, the filter 120 may be a RF filter defined, at least in part, based on a Code Division Multiple Access (CDMA) protocol in the wireless network 105, for example, a mobile communication or digital cellular network. Consistent with another embodiment, the filter 120 may be defined at least in part based on a Universal Mobile Telecommunication System (UMTS) protocol in the wireless network 105.

In operation, for a band selection filer, the software (S/W) 125 may vary the center frequencies and the bandwidths corresponding to most communication bands. Of course, the software (S/W) 125 may be used with other types of filters, such as a coarse channel selection filter. A feedback stabilization technique may control the Q-factor of the filter 120. While the width of the pass-band of the filter 120 may be determined by the Q-factor, the desired Q-factor for the filter 120 may depend upon an air interface standard being used. For example, the filter 120 may be disposed in a flexible radio that allows for different air interface standards having different channel bandwidths (e.g., GSM 200 KHz channels, UMTS 5 MHz channels, CDMA 1.25 MHz channels). In this way, the variable feedback may enable handling of different channel bandwidths because a variation in feedback may adjust the Q-factor for the filter 120.

That is, given a large variety of frequency bands available for mobile communications, to avoid manufacturing radios only for a certain type(s) of frequency band(s) or a variety of air interface standards, the frequency band of operation of the filter 120 may be defined by the software (S/W) 125. Each frequency band and a specific channel in use define a center frequency and a required relative bandwidth. The air interface standards and thus the channel bandwidth dictate the bandwidth of the filter 20. With such control logic in the software (S/W) 125, reconfigurable filters may be used as pre-selector filters and post-selector filters. For example, a pre-selector filter may be used at a receiver input, and a post-selector filter may be used between the radio 130(1) and the power amplifier 132.

The telecommunication system 100 may be defined, at least in part, by a Third Generation (3G) mobile communication standard based on a UMTS) protocol, in one embodiment. For example, the telecommunication system 100 may operate according to a CDMA standard or a GSM standard, which is a land mobile pan-European digital cellular radio communications system. In this way, the transceiver 115 may send or receive, voice, data, or a host of voice and data services in different generations of the wireless network 105, including a digital cellular network based on one or more standards including UMTS and 3G-1X (CDMA) 2000), as well as IS-95 CDMA, GSM and Time Division Multiple Access (TDMA).

Referring to FIG. 3, a flexible or reconfigurable filter 120*a* is depicted with a stabilized feedback path 300 for Q-factor enhancement that uses the feedback shown in FIG. 1 consistent with one embodiment of the present invention. An inductance L and a capacitance C of the filter 120 may define a resonant frequency $f_{res}=1/[2\times pi \times squareroot(L\times C)]$ and a ratio between L and C may define the Q-factor of a resonant circuit without a Q-factor enhancement. The filter 120*a* may include a resonant circuit 305 having an input terminal 310*a* and an output terminal 310*b*. Use of one or more feedback stabilization techniques, as described above, in the stabilized feedback path 300 of the resonant circuit 305 may provide a variable feedback that provides a stable Q-factor enhancement.

Based on the variable feedback, the resonant circuit 305 may tune a center frequency and a bandwidth of the filter 120*a*, realizing a desired Q-factor for the filter 120*a*. The coupling of the stabilized feedback path 300 in the resonant circuit 305 includes at least one of an electrical coupling, a magnetic coupling, an electromagnetic coupling, a transformer coupling and/or any combination thereof.

The resonant circuit 305 may be encapsulated from its surroundings. This encapsulating may be done in different ways. As two examples, in a first case, at the input terminal 310*a* and the output terminal 310*b* of the resonant circuit 305, a pair of isolation amplifiers may be placed, respectively. An isolation amplifier refers to an amplifier that may pass through a RF signal one way but an unwanted RF signal cannot go backwards through the same amplifier. In this manner, variations in an outer source and a load impedance of the filter 120*a* may not be experienced by the resonant circuit 305. The center frequency and Q-factor of the filter 120*a*, and thus the bandwidth may not be impacted even if the outer source or the load impedance changes.

In a second case, the resonant circuit 305 may further comprise a resonant structure buried into at least one inner layer to electrically shield the resonant circuit 305 of the filter 120*a* to control the desired Q-factor in a stable manner that substantially avoids oscillation. Therefore, the resonant structure may be shielded by burying into the inner layers. The resonant structure may either be realized out of one or more elements like a capacitor and an inductor or as a transmission line, whereby these elements may be folded to save space. For example, the filter 120a may be realized in a low temperature cofired ceramic (LTCC) fabrication technology.

In one embodiment, the filter 120a may further comprise a first isolation amplifier 315a coupled to the input terminal 310a of the resonant circuit 305 and a second isolation amplifier 315b coupled to the output terminal 310b thereof. The first and second isolation amplifiers 315a, 315b may encapsulate the resonant circuit 305 from its surroundings and the stabilized feedback path 300 to develop a negative parallel resistance, i.e., to compensate for at least part of the losses of a resonant structure, in the filter 120a.

The filter 120a may further comprise analog circuitry including a buffer amplifier 320 to provide a high input-impedance and an amplitude detector 322 at the output of the buffer amplifier 320 to detect self oscillation. At the output of the buffer amplifier 320, a programmable gain amplifier 325 may be coupled to provide a desired feedback amount. In addition, the filter 120a may further incorporate a logic and driver module 330, which in turn, may be coupled to the first and second isolation amplifiers 315a, 315b. The logic and driver module 330 may couple to the programmable gain amplifier 325 and the resonant circuit 305 to overcome a tolerance of an active feedback for the variable feedback to stabilize an amount of Q-factor enhancement of the desired Q-factor.

In the logic and driver module 330, a storage device 335 may store the S/W 125 shown in FIG. 1. Using the programmable gain amplifier 325, the S/W 125 in the filter 120a may adjust the variable feedback, thus overcoming the tolerance of the active feedback. In this way, the logic and driver module 330 may hide a variation in at least one of an external source and a load impedance of the filter 120a from the resonant circuit 305.

The filter 120a may further comprise an interface 340 being coupled to the logic and driver module 330 to digitally program one or more parameters of the analog circuitry of the resonant circuit 305. Examples of these parameters of the analog circuitry of the resonant circuit 305 a capacitance value parameter, a center frequency parameter and a bandwidth parameter. The logic and driver module 330 may perform a mapping from center frequency and bandwidth commands into tuning voltages for L and C and a gain setting for the variable feedback amplifier 325.

For the filter 120a, in one embodiment, a non-volatile semiconductor memory, for example, a FLASH random access memory (RAM) 345 may store calibration data, such as in a table 350. The RAM 345 may fine-tune a feedback amount for the variable feedback based on the calibration data and enable a digital access to a capacitance value to tune the center frequency. Likewise, the S/W 125 may set one or more characteristics of the filter 120a through the interface 340 to realize a building block of a system that fulfills a conventional radio function.

Essentially, the analog circuitry may include one or more signal processing stages, such as the buffer amplifier 320 stage, the programmable gain amplifier 325 stage and the first and second isolation amplifiers 315a, 315b stages coupled to the storage 335. The storage 335, e.g., storing the S/W 125 may include instructions that tune the center frequency and the bandwidth over a wide range based on one or more characteristics of the filter 120a during operation thereof and support a distributed filtering across these signal processing stages.

The analog circuitry may further comprise an oscillatory circuit 355 having a capacitor 360 and an inductor 365. The instructions stored in the S/W 125 may cause the variable feedback to tune the capacitor 360. Based on the tuning of the capacitor 360, the S/W 125 may obtain the center frequency and the bandwidth of the filter 120a at a first frequency band.

A core resonant circuit, such as the oscillatory circuit 355 comprising the capacitor 360, C and the inductor 365, L may provide as a passive structure. i.e., without feedback—a Q of 100. For the filter 120a to be able to select a 5 MHZ bandwidth at 2000 MHz, the desired Q is of the order 2000/5=400. However, most inductors and capacitors may not provide Q beyond 200 let alone a Q of 400, that is, 4 times higher than 100, in this example. Generally, a relatively higher Q-factor may be obtained, e.g., by selecting passive components with inherently better Q or artificially enriching the devices by active cancellation of their losses because a high resistive loss in a reactive device means low Q. But often it is rarely possible to get rid of some components losses. To compensate for at least a portion of these losses, in a passive L C structure, a positive feedback may be applied. That is, the variable feedback may be increased to reach the Q of 400. Reaching a Q of 400 means that a substantial part of these losses in the passive L C structure may canceled by the variable feedback without increasing feedback to a point where more signal energy than is actually lost in a passive core resonant circuit is fedback, avoiding oscillation.

The S/W 125 may reconfigure the center frequency and the bandwidth of the filter 120a, controlling the desired Q-factor for the filter 120a at a second frequency band. This center frequency and the bandwidth may realize the desired Q-factor for the filter 120a in a stable manner that substantially avoids oscillation across a multiplicity of frequency bands in a radio. For example, in a frequency agile radio, wherein the filter 120a may be disposed in the 115 transceiver associated with the 110 communication node in the wireless network 105 shown in FIG. 1.

In operation, the first isolation amplifier 315a may deliver a current to the oscillatory circuit 355, such as a tank-circuit. The buffer amplifier 320 may provide a high input-impedance. The optional amplitude detector 322 may detect a self oscillation within the filter 120a. That is, especially when a relatively large amount of feedback is used to provide a large Q-factor enhancement there is high risk of oscillation and the amplitude detector 322 may precisely tune the feedback amount.

While the amplitude detector 322 may supervise aging or drift of components of the filter 120a, the S/W 125 using the calibration data may translate center frequency and bandwidth commands into tuning voltages. The calibration data table 350 may be realized through the RAM 345, e.g., a FLASH RAM and may be preprogrammed during production. In some embodiments, to achieve a relatively higher stop-band attenuation and a steeper filter function, the filter 120a may comprise several filter stages one after each other.

When the filter 120a is realized in the LTCC fabrication technology, typically Q-factors may stay below 100, but for some filter functions Q-factors up to 1000 may be desirable. As a high Q-factor allows for desired stop-band attenuation, duplex filters in the base station 110 may typically have Q-factors about 5000. For tuning the center frequency and the bandwidth, only the capacitor 360 and not the inductor 365 may be tuned. However, it is the product of the inductance (L) and the capacitance (C) that is generally responsible for a resonant frequency (f):

$$f = \frac{1}{2\pi\sqrt{LC}}$$

The ratio between the capacitance (C) and the inductance (L) corresponds to the Q-factor:

$$Q = \frac{R}{X} = \frac{R}{\omega \cdot L} = \frac{R \cdot \sqrt{L \cdot C}}{L} = R \cdot \sqrt{\frac{C}{L}}$$

From these equations it follows that using the variable feedback, either the capacitance (C) or the inductance (L) or both may be tuned. However, a variation of the inductance (L) typically is difficult to realize and therefore tuning is often limited to the capacitance (C) alone. In one embodiment of the present invention, a variable Q-factor may be obtained through realization of a negative parallel resistance. Using the variable feedback, a) the Q-factor may be tuned over a wide range and the Q-factor may be increased beyond what the filter 120a may inherently support.

Figure 2:
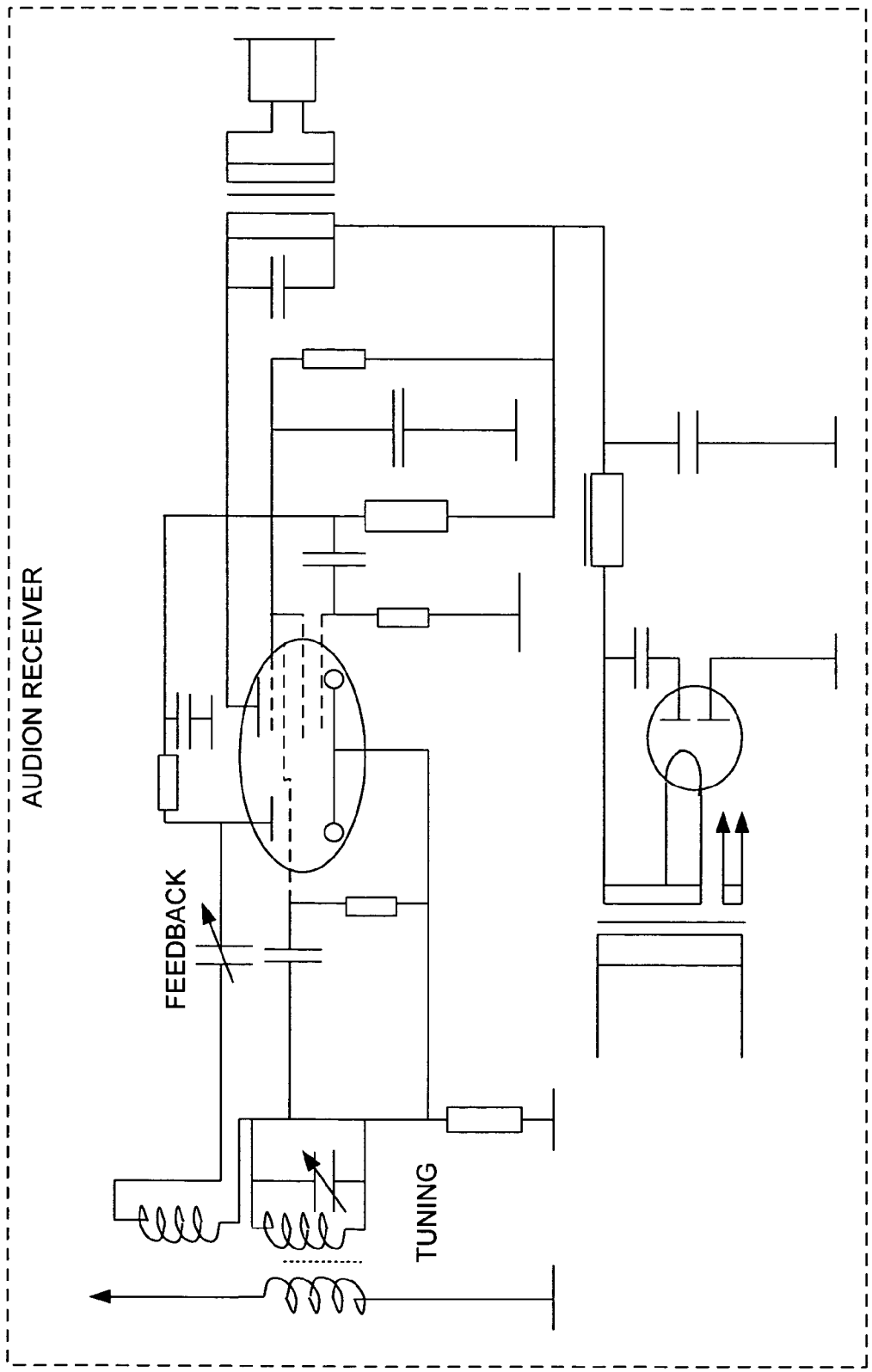
FIG. 2 illustrates a prior art technique for improving and tuning of Q-factor uses an Audion receiver.

The coupling of the stabilized feedback path 300 to the resonant circuit 305 may be performed in several ways. In an LTCC realization, for example, a coil of the resonant circuit 305 and a feedback coil may be placed on top of each other in different layers, inducing magnetic coupling. As a LTCC chip is mechanically robust, a distance between these two coils coupling into each other is relatively stable as opposed to the realization of the Audion receiver shown in FIG. 2 where the angle between the two coils coupling into each other is mechanically varied and is very sensitive. Especially alterations in a stray field can significantly influence the amount of feedback.

The filter 120a essentially avoids any mechanical variation by mapping a coupling variation into a gain variation of the stabilized feedback path 330, in one embodiment. For the filter 120a, the interface 340, such as a digital interface enables programming digitally any relevant parameters in the analog circuitry. Using the programmable gain amplifier 325, tuning of the capacitor 360 may be performed, where a tuning voltage may be generated by a digital-to-analog (D/A) converter, allowing for a digital access of a capacitance value and thus the center frequency.

Figure 4:
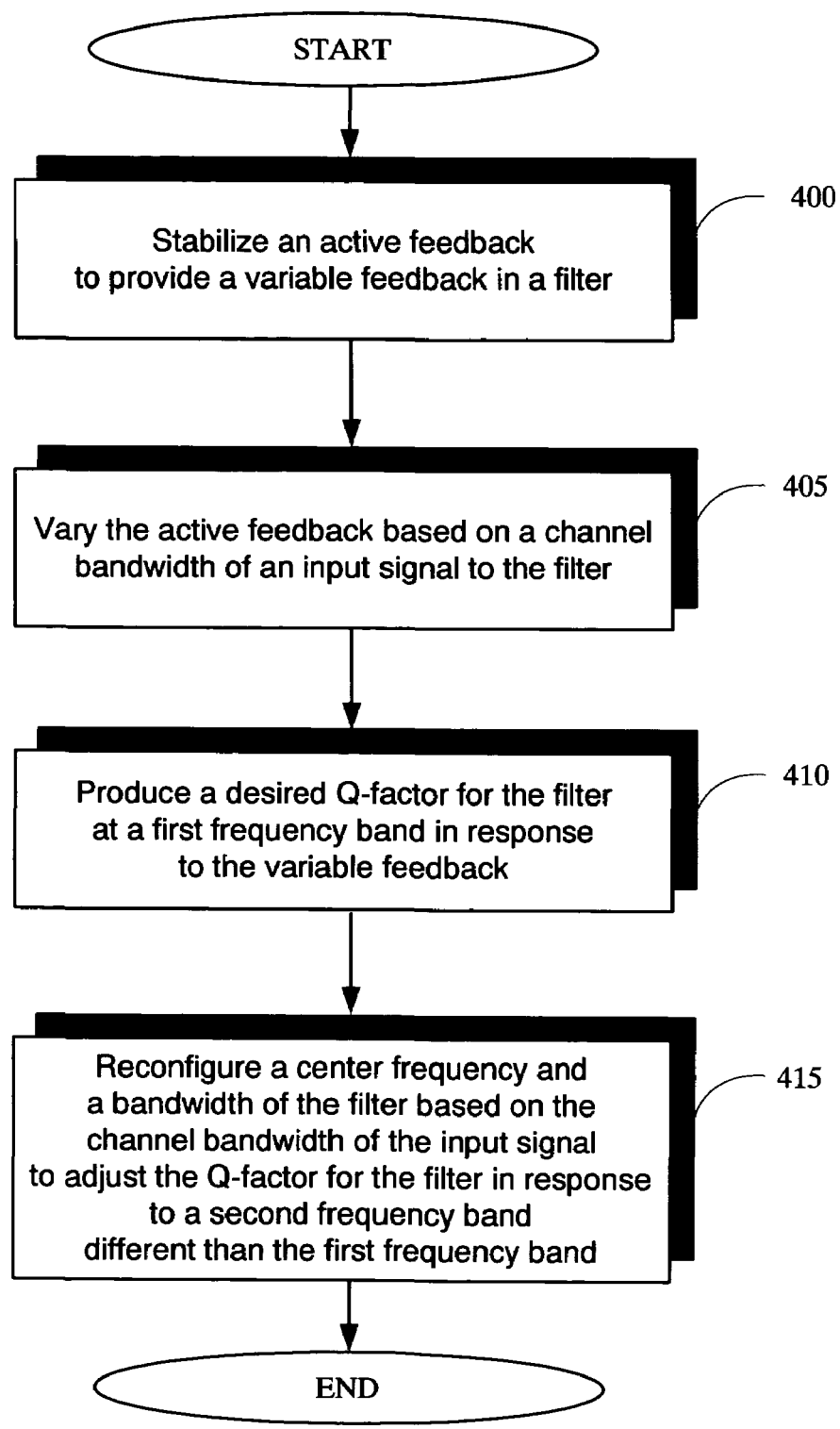
FIG. 4 illustrates a stylized representation for implementing a method of controlling a Q-factor for a filter, such as the flexible filter shown in FIG. 3 based on a variable feedback that tunes a center frequency and a bandwidth to realize a desired Q-factor by overcoming a tolerance of an active feedback according to one illustrative embodiment of the present invention.

Referring to FIG. 4, a stylized representation for implementing a method of controlling Q-factor for a filter, such as the flexible or reconfigurable filter 120a shown in FIG. 3 is provided according to one illustrative embodiment of the present invention. At block 400, an active feedback may be stabilized to provide a variable feedback in the filter 120a. By varying the active feedback based on a channel bandwidth of an input signal, such as an analog input signal at the input terminal 310a of the filter 120a, as indicated in block 405. As one example, the first frequency band for the base station 110, e.g., Node B may be a 3GPP-UMTS standard compliant signal at carrier frequencies of about 2000 Mega Hertz (MHz). In response to the variable feedback, a desired Q-factor may be produced for the filter 120a at a first frequency band, at block 410. A center frequency and a bandwidth of the filter 120a may be reconfigured, for example, using the S/W 125, based on the channel bandwidth of the input signal to adjust the Q-factor for the filter 120a at a second frequency band different than the first frequency band, as shown at block 415. For instance, the second frequency band may be a 3GPP-UMTS standard compliant signal at carrier frequencies of about 900 MHz or 450 MHz.

Figure 5:
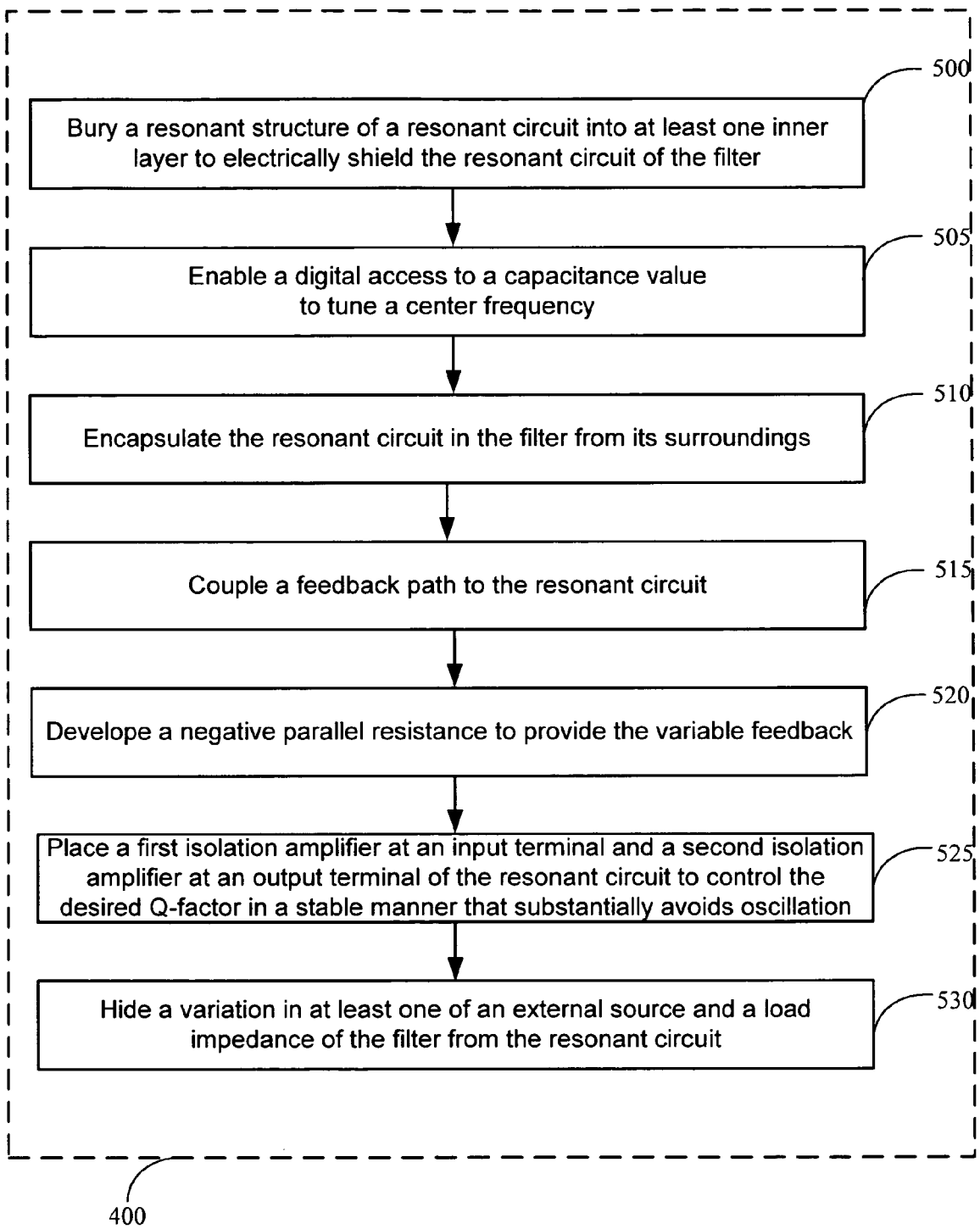
FIG. 5 illustrates a stylized representation for implementing a method for encapsulating a resonant circuit from its surroundings and developing a negative parallel resistance to provide the variable feedback, wherein the method isolates input and output of the resonant circuit to control the desired Q-factor in a stable manner that substantially avoids oscillation in accordance with one embodiment of the present invention.

Finally, turning to FIG. 5, a stylized representation for implementing a method of providing the variable feedback in the filter 120a shown in FIG. 3 is illustrated in accordance with one embodiment of the present invention. For example, as shown in FIG. 1, the filter 120a may be disposed in the transceiver 115 associated with the communication node 110 in the wireless network 105.

To adjust the Q-factor, an active feedback may be stabilized in the filter 120a. By isolating the input and output of the resonant circuit 305 and providing a variable feedback, a desired Q-factor for the filter 120a may be produced. This isolation may stabilize an amount of Q-factor enhancement of the desired Q-factor, in one embodiment. Based on the variable feedback, the Q-factor may be tuned over a wide range, for example, across a multiplicity of frequency bands. Thus, using the variable feedback, the Q-factor may be increased beyond what the filter 120a inherently supports.

As shown in block 500, furthermore, a resonant structure of the resonant circuit 305 may be buried into at least one inner layer to electrically shield the resonant circuit 305 of the filter 120a to control the Q-factor in a stable manner that substantially avoids oscillation. To tune the center frequency, at block 505, a digital access to a capacitance value of the capacitor 360 may be enabled. For example, the interface 340 may be used to digitally program one or more parameters of the programmable gain amplifier 325 in the analog circuitry of the filter 120a. Alternatively, the interface 340 may be used to digitally program one or more parameters of a programmable gain attenuator which may be disposed in lieu of the programmable gain amplifier 325 in the analog circuitry of the filter 120a. To fine tune a feedback amount for the variable feedback, the S/W 125 may utilize the calibration data stored in a non-volatile semiconductor memory, i.e., the RAM 345.

Consistent with one embodiment, the S/W 125 may set one or more characteristics of the filter 102a through the interface 340 to realize a building block of a system that fulfills a radio function. Based on such characteristics of the filter 120a, the center frequency and the bandwidth may be tuned over a wide range during operation thereof. By tuning a Q-factor of the capacitor 360, the filter 120a may be reconfigurably realized such that the center frequency and the bandwidth serve a multiplicity of frequency bands in a frequency agile radio.

In one embodiment, an access to the center frequency and the bandwidth may be provided without tuning the inductor 365 to tune the Q-factor of the capacitor 360. For example, the capacitor 360 may be tuned through at least one of a varactor diode, a micro-electro-mechanical systems varactor, a tunable dielectric and/or any combination thereof to generate a tuning voltage.

At block 510, a resonant structure the resonant circuit 305 and a feedback structure may be encapsulated to insulate from its surroundings. The stabilized feedback path 300 may be coupled to the resonant circuit 305 to realize the desired Q-factor, at block 515. This coupling of the stabilized feedback path 300 to the resonant circuit 305 includes at least one of an electrical coupling, a magnetic coupling, an electromagnetic coupling, a transformer coupling and any combination thereof. By mapping a coupling variation into a gain variation of the stabilized feedback path 300, a mechanical variation in a distance between a pair of coils coupling into each other for enabling the resonant structure may be avoided.

A negative parallel resistance may be developed at block 520 in the resonant circuit 305. To control the desired Q-factor in a stable manner that substantially avoids oscillation, the first isolation amplifier 315a may be laced at the input terminal 310a and the second isolation amplifier 315b may be placed at the output terminal 310b of the resonant circuit 305, at block 525. In this way, a variation in at least one of an external source and a load impedance of the filter 120a may be hidden from the resonant circuit 305, at block 530.

In this manner, a desired stabilization of a feedback amount may be obtained by encapsulating the resonant structure and the feedback structure. The feedback amount may be setup by varying the gain of the programmable gain amplifier 325. Fine-tuning of this feedback amount may enable the filter 120*a* to overcome production spread and temperature drift, in some embodiments. Therefore, an analog filter, such as the filter 120*a* may be realized the characteristics of which may be set by the S/W 125 through the interface 340, providing a radio function block that fulfills a system function.

Because the filter 120*a* is controllable by the S/W 125 it may serve as a building block of an analog software radio, the center frequency and the bandwidth of which may be tuned over a wide range during operation. Also, fine-tuning of the feedback amount may be provided during manufacturing using the calibration data stored in a FLASH memory, i.e., the RAM 345. Alternatively, besides the oscillation detector 322, a temperature sensor inside the filter 120*a* and couple thereto the logic and driver module 330. So depending on actual temperature, different calibration entries may be read from RAM 345, in some embodiments. The filter 120*a* may significantly reduce constraints on duplex filters. By applying the distributed filtering at several signal processing stages, of the resonant circuit 305, cost of the filter 120*a* may be significantly reduced, as well. In one embodiment, the distributed filtering entails use of several filters like the filter 120*a* disposed in a transmitter chain. Consequently, a duplex filter with relatively high power doesn't have to be such selective—so the signal processing effort in the duplex filter may be substantially reduced.

Advantageously, in some embodiments, the feedback and resonance may be stabilized in the filter 120*a* and thus a robust filtering against an external influence may be obtained. The use of encapsulation and/or a negative parallel resistance for providing the active feedback may allow for realizing Q-factors relatively higher than a resonant structure may inherently support. By stabilizing the feedback and thus substantially avoiding oscillation, an active Q-factor enhancement may be provided in active filters, such as the filter 120*a*. Specifically, as shown in FIG. 3, by combining the use of electrical shield of a resonant structure with the first and second isolation amplifiers 315*a*, 315*b* a desired encapsulation of the resonant circuit 305 may be obtained.

While the invention has been illustrated herein as being useful in a telecommunications network environment, it also has application in other connected environments. For example, two or more of the devices described above may be coupled together via device-to-device connections, such as by hard cabling, radio frequency signals (e.g., 802.11(a), 802.11(b), 802.11(g), Bluetooth, or the like), infrared coupling, telephone lines and modems, or the like. The present invention may have application in any environment where two or more users are interconnected and capable of communicating with one another.

Those skilled in the art will appreciate that the various system layers, routines, or modules illustrated in the various embodiments herein may be executable control units. The control units may include a microprocessor, a microcontroller, a digital signal processor, a processor card (including one or more microprocessors or controllers), or other control or computing devices as well as executable instructions contained within one or more storage devices. The storage devices may include one or more machine-readable storage media for storing data and instructions. The storage media may include different forms of memory including semiconductor memory devices such as dynamic or static random access memories (DRAMs or SRAMS), erasable and programmable read-only memories (EPROMs), electrically erasable and programmable read-only memories (EEPROMs) and flash memories; magnetic disks such as fixed, floppy, removable disks; other magnetic media including tape; and optical media such as compact disks (CDs) or digital video disks (DVDs). Instructions that make up the various software layers, routines, or modules in the various systems may be stored in respective storage devices. The instructions, when executed by a respective control unit, causes the corresponding system to perform programmed acts.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

We claim:

1. A method of controlling a Q-factor for a filter including an oscillatory circuit having a tunable central frequency and bandwidth, the method comprising:

isolating said filter using a first isolation amplifier at an input terminal to the filter and a second isolation amplifier at an output terminal of the filter;

stabilizing an active feedback to provide a variable feedback in said filter, the variable feedback being provided via a feedback path formed within the first and second isolation amplifiers, the feedback path being coupled to the oscillatory circuit;

varying the active feedback based on an input signal to said filter; and in response to the variable feedback, producing a desired Q-factor for said filter at a first frequency band.

2. A method, as set forth in claim 1, further comprising:

in response to a second frequency band different than the first frequency band, reconfiguring the center frequency and the bandwidth of the oscillatory circuit in said filter based on a channel bandwidth of the input signal to adjust the Q-factor for said filter.

3. A method, as set forth in claim 1, further comprising:

combining an electrical shield of a resonant structure with at least one of the first and second isolation amplifiers to encapsulate a resonant circuit from its surroundings, the resonant circuit comprising the oscillatory circuit, the feedback path and the isolation amplifiers.

4. A method, as set forth in claim 3, further comprising:

based on the variable feedback, tuning the desired Q-factor over a wide range, wherein coupling of said feedback path to said resonant circuit includes at least one of an electrical coupling, a magnetic coupling, an electromagnetic coupling, a transformer coupling and any combination thereof.

5. A method, as set forth in claim 3, further comprising:

based on the variable feedback, increasing the desired Q-factor beyond what said filter inherently supports, wherein coupling of said feedback path to said resonant circuit includes at least one of an electrical coupling, a magnetic coupling, an electromagnetic coupling, a transformer coupling and any combination thereof 6. A method, as set forth in claim 3, further comprising:

burying the resonant structure of said resonant circuit into at least one inner layer to electrically shield said resonant circuit of said filter to control the desired Q-factor in a stable manner that substantially avoids oscillation.

7. A method, as set forth in claim 1, further comprising:
developing a negative parallel resistance to provide the variable feedback.

8. A method, as set forth in claim 1, further comprising:
providing an interface to program one or more parameters of a gain amplifier in analog circuitry of said filter.

9. A method, as set forth in claim 8, further comprising:
storing calibration data in a non-volatile semiconductor memory for fine-tuning a feedback amount for the variable feedback based on the calibration data.

10. A method, as set forth in claim 8, further comprising:
enabling a digital access to a capacitance value to tune the center frequency.

11. A method, as set forth in claim 8, further comprising:
using a software module to set one or more characteristics of said filter through said interface to realize a building block of a system that fulfills a radio function.

12. A method, as set forth in claim 11, further comprising:
tuning the center frequency and the bandwidth over a wide range based on said one or more characteristics of said filter during operation thereof.

13. A method, as set forth in claim 8, further comprising:
supporting a distributed filtering at one or more signal processing stages of said filter.

14. A method, as set forth in claim 1, further comprising:
providing an interface to digitally program one or more parameters of a programmable gain attenuator in analog circuitry of said filter.

15. A method, as set forth in claim 1, further comprising:
disposing said filter in a transceiver associated with a communication node in a wireless network;
providing in said filter an oscillatory circuit having a capacitor and an inductor;
using the variable feedback to tune said capacitor; and
based on the tuning of said capacitor, obtaining the center frequency and the bandwidth of said filter that realizes the desired Q-factor for said filter of said transceiver in a stable manner that substantially avoids oscillation.

16. A method, as set forth in claim 15, further comprising:
tuning a Q-factor of said capacitor to reconfigurably realize said filter such that the center frequency and the bandwidth serves a multiplicity of frequency bands in a frequency agile radio; and
providing an access to the center frequency and the bandwidth without tuning said inductor to tune the Q-factor of said capacitor.

17. A method, as set forth in claim 15, further comprising:
tuning said capacitor through at least one of a varactor diode, a micro-electro-mechanical systems varactor, a tunable dielectric and any combination thereof to generate a tuning voltage.

18. A method of controlling a Q-factor for a filter, the method comprising:
stabilizing an active feedback to provide a variable feedback in said filter by developing a negative parallel resistance to provide the variable feedback;
varying the active feedback based on an input signal to said filter; and in response to the variable feedback, producing a desired Q-factor for said filter at a first frequency band by:
disposing said filter in a transceiver associated with a communication node in a wireless network;
providing a feedback path and a resonant circuit having an input terminal and an output terminal in said filter;
coupling the feedback path to said resonant circuit to realize the desired Q-factor for said filter of said transceiver; and
placing a first isolation amplifier at said input terminal and a second isolation amplifier at said output terminal of said resonant circuit to control the desired Q-factor in a stable manner that substantially avoids oscillation.

19. A method, as set forth in claim 18, further comprising:
overcoming a tolerance of the active feedback for the variable feedback to provide the desired Q-factor; and
hiding a variation in at least one of an external source and a load impedance of said filter from said resonant circuit to stabilize an amount of enhancement of the Q-factor.

20. A method of controlling a Q-factor for a filter, the method comprising:
combining an electrical shield of a resonant structure with an isolation amplifier to encapsulate a resonant circuit from its surroundings;
stabilizing an active feedback to provide a variable feedback in said filter;
varying the active feedback based on an input signal to said filter; and
in response to the variable feedback, producing a desired Q-factor for said filter at a first frequency band;
burying the resonant structure of said resonant circuit into at least one inner layer to electrically shield said resonant circuit of said filter to control the desired Q-factor in a stable manner that substantially avoids oscillation; and
mapping a coupling variation into a gain variation of said feedback path to avoid a mechanical variation in a distance between a pair of coils coupling into each other for enabling the resonant structure.

21. A filter comprising:
a resonant circuit having an input terminal and an output terminal;
a first isolation amplifier coupled to an input terminal of said resonant circuit;
a second isolation amplifier coupled to an output terminal of said resonant circuit, wherein said first and second isolation amplifiers encapsulate said resonant circuit from its surroundings; and
a feedback path coupled to said resonant circuit, stabilization of feedback in said feedback path to provide a variable feedback, wherein said resonant circuit to stabilize an active feedback in said filter, vary the active feedback based on an input signal to said filter and produce a desired Q-factor for said filter at a first frequency band in response to the variable feedback.

22. A filter, as set forth in claim 21, wherein coupling of said feedback path to said resonant circuit includes at least one of an electrical coupling, a magnetic coupling, an electromagnetic coupling, a transformer coupling and any combination thereof.

23. A filter, as set forth in claim 21, said resonant circuit further comprising:
a resonant structure buried into at least one inner layer to electrically shield said resonant circuit of said filter to control the desired Q-factor in a stable manner that substantially avoids oscillation.

24. A filter, as set forth in claim 21, further comprising:
analog circuitry including one or more signal processing stages coupled to a storage storing instructions to tune a center frequency and a bandwidth over a wide range based on one or more characteristics of said filter during operation thereof and support a distributed filtering across said one or more signal processing stages.

25. A filter comprising:
a resonant circuit having an input terminal and an output terminal;
a feedback path coupled to said resonant circuit, stabilization of feedback in said feedback path to provide a variable feedback, wherein said resonant circuit to stabilize an active feedback in said filter, vary the active feedback based on an input signal to said filter and produce a desired Q-factor for said filter at a first frequency band in response to the variable feedback;
a first isolation amplifier coupled to said input terminal of said resonant circuit; and
a second isolation amplifier coupled to said output terminal of said resonant circuit, wherein said first and second isolation amplifiers to encapsulate said resonant circuit from its surroundings and said feedback path to develop a negative parallel resistance in said filter.

26. A filter comprising:
a resonant circuit having an input terminal and an output terminal;
a feedback path coupled to said resonant circuit, stabilization of feedback in said feedback path to provide a variable feedback, wherein said resonant circuit to stabilize an active feedback in said filter, vary the active feedback based on an input signal to said filter and produce a desired Q-factor for said filter at a first frequency band in response to the variable feedback;
a resonant structure buried into at least one inner layer to electrically shield said resonant circuit of said filter to control the desired Q-factor in a stable manner that substantially avoids oscillation; and
analog circuitry including a buffer amplifier coupled to a programmable gain amplifier; and
a logic and driver module coupled to said first and second isolation amplifiers, said programmable gain amplifier and said resonant circuit to overcome a tolerance of the active feedback for the variable feedback to provide the desired Q-factor and hide a variation in at least one of an external source and a load impedance of said filter from said resonant circuit to stabilize an amount of enhancement of the Q-factor.

27. A filter, as set forth in claim 26, further comprising:
an interface coupled to said logic and driver module to digitally program one or more parameters of said analog circuitry.

28. A filter, as set forth in claim 27, further comprising:
a non-volatile semiconductor memory storing calibration data, said non-volatile semiconductor memory coupled to said logic and driver module for fine-tuning a feedback amount for the variable feedback based on the calibration data and enabling a digital access to a capacitance value to tune the center frequency.

29. A filter, as set forth in claim 27, wherein said logic and driver module further comprising:
a storage storing a software module to reconfigure a center frequency and a bandwidth of said filter to control the desired Q-factor for said filter at a second frequency band and set one or more characteristics of said filter through said interface to realize a building block of a system that fulfills a radio function.

30. A filter, comprising:
a resonant circuit having an input terminal and an output terminal;
a feedback path coupled to said resonant circuit, stabilization of feedback in said feedback path to provide a variable feedback, wherein said resonant circuit to stabilize an active feedback in said filter, vary the active feedback based on an input signal to said filter and produce a desired Q-factor for said filter at a first frequency band in response to the variable feedback; and
analog circuitry including one or more signal processing stages coupled to a storage storing instructions to tune a center frequency and a bandwidth over a wide range based on one or more characteristics of said filter during operation thereof and support a distributed filtering across said one or more signal processing stages, wherein said analog circuitry further comprising:
an oscillatory circuit having a capacitor and an inductor, wherein said instructions to cause the variable feedback to tune said capacitor, and based on the tuning of said capacitor, obtain the center frequency and the bandwidth of said filter that realizes the desired Q-factor for said filter in a stable manner that substantially avoids oscillation across a multiplicity of frequency bands in a frequency agile radio, wherein said filter is disposed in a transceiver associated with a communication node in a wireless network.

31. An article comprising a computer readable storage medium storing instructions that, when executed cause a system to:
isolate a filter using a first isolation amplifier at an input terminal to the filter and a second isolation amplifier at an output terminal of the filter;
stabilize an active feedback to provide a variable feedback in said filter, the variable feedback being provided via a feedback path formed within the first and second isolation amplifiers, the feedback path being coupled to an oscillatory circuit in the filter, the oscillatory circuit having a tunable central frequency and bandwidth;
vary the active feedback based on an input signal to said filter; and
produce a desired Q-factor for said filter at a first frequency band in response to the variable feedback.

32. An article, as set forth in claim 31, comprising a medium storing instructions that, when executed cause a system to:
reconfigure a center frequency and a bandwidth of said filter based on a channel bandwidth of the input signal to adjust the Q-factor for said filter in response to a second frequency band different than the first frequency band.

33. An article, as set forth in claim 31, comprising a medium storing instructions that, when executed cause a system to:
combine an electrical shield of a resonant structure with an isolation amplifier to encapsulate a resonant circuit from its surroundings; and
develop a negative parallel resistance to provide the variable feedback.

34. An article, as set forth in claim 31, comprising a medium storing instructions that, when executed cause a system to:
set one or more characteristics of said filter to tune a center frequency and a bandwidth over a wide range based on said one or more characteristics of said filter during operation thereof; and
tune a Q-factor of a capacitor to reconfigurably realize said filter such that the center frequency and the bandwidth serves a multiplicity of frequency bands, wherein an access to the center frequency and the bandwidth is provided without tuning an inductor.

35. An article comprising a computer readable storage medium storing instructions that, when executed cause a system to:

stabilize an active feedback to provide a variable feedback in said filter;

vary the active feedback based on an input signal to said filter;

produce a desired Q-factor for said filter at a first frequency band in response to the variable feedback;

combine an electrical shield of a resonant structure with an isolation amplifier to encapsulate a resonant circuit from its surroundings;

develop a negative parallel resistance to provide the variable feedback;

map a coupling variation into a gain variation of a feedback path coupled to said resonant circuit;

store calibration data in a non-volatile semiconductor memory for fine-tuning a feedback amount for the variable feedback based on the calibration data;

enable a digital access to a capacitor to tune the center frequency; and based on the tuning of said capacitor, obtain a center frequency and a bandwidth of said filter that realizes the desired Q-factor for said filter in a stable manner that substantially avoids oscillation.

* * * * *